US007670944B2

(12) United States Patent
Raaijmakers et al.

(10) Patent No.: US 7,670,944 B2
(45) Date of Patent: Mar. 2, 2010

(54) CONFORMAL LINING LAYERS FOR DAMASCENE METALLIZATION

(75) Inventors: Ivo Raaijmakers, Bilthoven (NL); Suvi P. Haukka, Helsinki (FI); Ville A. Saanila, Helsinki (FI); Pekka J. Soininen, Espoo (FI); Kai-Erik Elers, Helsinki (FI); Ernst H.A. Granneman, Hilversum (NL)

(73) Assignee: ASM International N.V. (NL)

( * ) Notice: Subject to any disclaimer, the term of this patent is extended or adjusted under 35 U.S.C. 154(b) by 453 days.

(21) Appl. No.: 11/511,877

(22) Filed: Aug. 28, 2006

(65) Prior Publication Data

US 2007/0096321 A1    May 3, 2007

Related U.S. Application Data

(60) Continuation of application No. 10/737,315, filed on Dec. 15, 2003, now Pat. No. 7,102,235, which is a division of application No. 09/644,416, filed on Aug. 23, 2000, now Pat. No. 6,727,169.

(60) Provisional application No. 60/176,944, filed on Jan. 18, 2000, provisional application No. 60/159,799, filed on Oct. 15, 1999.

(51) Int. Cl.
*H01L 21/4763* (2006.01)

(52) U.S. Cl. .................. 438/627; 438/643; 438/644; 438/648; 438/628; 438/629; 438/638; 438/653; 438/654; 438/656; 438/658; 438/677; 438/685; 257/761; 257/E21.584; 257/E21.579

(58) Field of Classification Search ................ 438/622, 438/625, 627, 628, 641, 642, 643, 644, 658, 438/677, 680, 681, 685, 761, 762, 763, 774, 438/775, 674, 629, 638, 653, 654, 656, 648; 257/761, E21.579, E21.584, E21.585
See application file for complete search history.

(56) References Cited

U.S. PATENT DOCUMENTS

| 3,800,000 | A  | * | 3/1974  | Fahey ...................... 585/301 |
| 6,203,613 | B1 | * | 3/2001  | Gates et al. ................. 117/104 |
| 6,277,765 | B1 | * | 8/2001  | Cheng et al. ................ 438/773 |
| 6,358,829 | B2 | * | 3/2002  | Yoon et al. .................. 438/597 |
| 6,368,954 | B1 | * | 4/2002  | Lopatin et al. .............. 438/627 |
| 6,429,524 | B1 | * | 8/2002  | Cooney et al. .............. 257/762 |
| 6,482,733 | B2 | * | 11/2002 | Raaijmakers et al. ....... 438/633 |

(Continued)

FOREIGN PATENT DOCUMENTS

KR    10-1999-0062428    7/1999

(Continued)

*Primary Examiner*—M. Wilczewski
(74) *Attorney, Agent, or Firm*—Knobbe, Martens Olson & Bear LLP

(57) ABSTRACT

Method and structures are provided for conformal lining of dual damascene structures in integrated circuits. Trenches and contact vias are formed in insulating layers. The trenches and vias are exposed to alternating chemistries to form monolayers of a desired lining material. Exemplary process flows include alternately pulsed metal halide and ammonia gases injected into a constant carrier flow. Self-terminated metal layers are thus reacted with nitrogen. Near perfect step coverage allows minimal thickness for a diffusion barrier function, thereby maximizing the volume of a subsequent filling metal for any given trench and via dimensions.

16 Claims, 14 Drawing Sheets

U.S. PATENT DOCUMENTS

| | | | |
|---|---|---|---|
| 6,534,395 B2 * | 3/2003 | Werkhoven et al. | 438/627 |
| 6,627,539 B1 * | 9/2003 | Zhao et al. | 438/638 |
| 6,664,192 B2 * | 12/2003 | Satta et al. | 438/704 |
| 6,686,271 B2 * | 2/2004 | Raaijmakers et al. | 438/633 |
| 6,699,783 B2 * | 3/2004 | Raaijmakers et al. | 438/633 |
| 6,703,708 B2 * | 3/2004 | Werkhoven et al. | 257/751 |
| 6,723,635 B1 * | 4/2004 | Ngo et al. | 438/627 |
| 6,727,169 B1 * | 4/2004 | Raaijmakers et al. | 438/622 |
| 6,759,325 B2 * | 7/2004 | Raaijmakers et al. | 438/633 |
| 6,836,017 B2 * | 12/2004 | Ngo et al. | 257/751 |
| 6,863,727 B1 * | 3/2005 | Elers et al. | 117/93 |
| 6,869,876 B2 * | 3/2005 | Norman et al. | 438/680 |
| 6,902,763 B1 * | 6/2005 | Elers et al. | 427/250 |
| 6,955,986 B2 * | 10/2005 | Li | 438/687 |
| 6,960,537 B2 * | 11/2005 | Shero et al. | 438/775 |
| 6,986,914 B2 * | 1/2006 | Elers et al. | 427/255.23 |
| 7,045,406 B2 * | 5/2006 | Huotari et al. | 438/198 |
| 7,102,235 B2 * | 9/2006 | Raaijmakers et al. | 257/758 |
| 7,208,418 B1 * | 4/2007 | Okada et al. | 438/696 |
| 7,329,590 B2 * | 2/2008 | Elers et al. | 438/473 |
| 7,405,453 B2 * | 7/2008 | Shero et al. | 257/410 |
| 7,410,666 B2 * | 8/2008 | Elers et al. | 427/97.7 |
| 7,419,903 B2 * | 9/2008 | Haukka et al. | 438/627 |
| 2002/0182320 A1 * | 12/2002 | Leskela et al. | 427/250 |
| 2003/0219979 A1 * | 11/2003 | Choi et al. | 438/685 |
| 2004/0192021 A1 * | 9/2004 | Li | 438/622 |
| 2005/0106877 A1 * | 5/2005 | Elers et al. | 438/689 |
| 2006/0079090 A1 * | 4/2006 | Elers et al. | 438/685 |
| 2007/0059502 A1 * | 3/2007 | Wang et al. | 428/209 |

FOREIGN PATENT DOCUMENTS

KR    100269328 B1    7/2000

* cited by examiner

US 7,670,944 B2

CONFORMAL LINING LAYERS FOR DAMASCENE METALLIZATION

REFERENCE TO RELATED APPLICATION

This application is a continuation of U.S. patent application Ser. No. 10/737,315 of Raaijmakers et al., filed Dec. 15, 2003 now U.S. Pat. No. 7,102,235, which is a divisional of U.S. patent application Ser. No. 09/644,416 of Raaijmakers et al., filed Aug. 23, 2000 now U.S. Pat. No. 6,727,169, which claims the priority benefit of U.S. provisional Application No. 60/159,799 of Raaijmakers et al., filed Oct. 15, 1999 and provisional application No. 60/176,944 of Raaijmakers et al., filed Jan. 18, 2000.

FIELD OF THE INVENTION

The invention relates generally to forming lining layers in high aspect-ratio voids during the fabrication of integrated circuits, and more particularly to barrier layers lining trenches and contact vias in dual damascene metallization schemes.

BACKGROUND OF THE INVENTION

When fabricating integrated circuits, layers of insulating, conducting and semiconducting materials are deposited and patterned to produce desired structures. "Back end" or metallization processes include contact formation and metal line or wire formation. Contact formation vertically connects conductive layers through an insulating layer. Conventionally, contact vias or openings are formed in the insulating layer, which typically comprises a form of oxide such as borophosphosilicate glass (BPSG) or oxides formed from tetraethylorthosilicate (TEOS) precursors. The vias are then filled with conductive material, thereby interconnecting electrical devices and wiring above and below the insulating layers. The layers interconnected by vertical contacts typically include horizontal metal lines running across the integrated circuit. Such lines are conventionally formed by depositing a metal layer over the insulating layer, masking the metal layer in a desired wiring pattern, and etching away metal between the desired wires or conductive lines.

Damascene processing involves forming trenches in the pattern of the desired lines, filling the trenches with a metal or other conductive material, and then etching the metal back to the insulating layer. Wires are thus left within the trenches, isolated from one another in the desired pattern. The etch back process thus avoids more difficult photolithographic mask and etching processes of conventional metal line definition.

In an extension of damascene processing, a process known as dual damascene involves forming two insulating layers, typically separated by an etch stop material, and forming trenches in the upper insulating layer, as described above for damascene processing. After the trenches have been etched, a further mask is employed to etch contact vias downwardly through the floor of the trenches and the lower insulating layer to expose lower conductive elements where contacts are desired.

Conductive elements, such as gate electrodes, capacitors, contacts, runners and wiring layers, must each be electrically isolated from one another for proper integrated circuit operation. In addition to providing insulating layers around such conductive elements, care must be taken to prevent diffusion and spiking of conductive materials through the insulating layers, which can cause undesired short circuits between among devices and lines. Protective barriers are often formed between via or trench walls and metals in a substrate assembly, to aid in confining deposited material within the via or trench walls. Barriers are thus useful for damascene and dual damascene interconnect applications, particularly for small, fast-diffusing elements such as copper.

Candidate materials for protective barriers should foremost exhibit effective diffusion barrier properties. Additionally, the materials should demonstrate good adhesion with adjacent materials (e.g., oxide via walls, adhesion layers, etch stop layers and/or metallic materials that fill the vias and trenches). For many applications, a barrier layer is positioned in a current flow path and so must be conductive. Typically, barriers have been formed of metal nitrides ($MN_x$), such as titanium nitride (TiN), tantalum nitride (TaN), and tungsten nitride (WN), which are dense and adequately conductive for lining contact vias, wiring trenches, and other conductive barrier applications.

These lined vias or trenches are then filled with metal by any of a variety of processes, including chemical vapor deposition (CVD), physical vapor deposition (PVD), and electroplating. For effective conductivity and to avoid electromigration during operation, the metal of a contact or wiring layer should fill the via or trench without leaving voids or key holes. Completely filling deep, narrow openings with conductive material is becoming ever more challenging as integrated circuit dimensions are constantly scaled down in pursuit of faster operational processing speeds and lower power consumption.

As illustrated in FIGS. 1 to 2, utilizing a conductive barrier layer and/or other liners makes filling the trenches and vias of dual damascene processing even more difficult. FIG. 1 illustrates a dual damascene process in which an upper insulating layer 10 is formed over a lower insulating layer 12, which is in turn formed over a conductive wiring layer 14, preferably with an intervening dielectric diffusion barrier 15. This dielectric barrier 15 serves to prevent copper or other conductive material of the underlying runner 14 from diffusing into the overlying dielectric layer 12.

A mask is employed to pattern and etch trenches 16 in a desired wiring pattern. In the illustrated embodiment, the trench 16 is etched down to the level of an etch stop layer 19, which is formed between the two insulating layers 10, 12. This etch stop layer 19 is typically patterned and etched, prior to deposition of the upper insulating layer 10, to form a hard mask that defines horizontal dimensions of desired contact vias that are to extend from the bottom of the trench 16. Continued etching through the hard mask 19 opens a contact via 20 from the bottom of the trench 16 to the lower conductive wiring layer 14. FIG. 1 also shows an upper etch stop or chemical mechanical polishing (CMP) stop layer 21 over the upper insulating layer 10 to stop a later planarization step, as will be appreciated by the skilled artisan.

Protective liners 22, preferably formed of conductive material, are then formed on the exposed horizontal and sidewall surfaces. Typically, the liners 22 at least include a metal nitride, and may additionally include adhesion enhancing and seeding layers. For example, the liner 22 can comprise a tri-layer of Ti/TiN/Cu. In such a structure, the titanium layer serves to improve adhesion with exposed oxide sidewalls; the titanium nitride serves as a diffusion barrier; and a thin copper layer serves as a seed for later electroplating of copper. In other examples, the liners 22 can include tantalum nitride or tungsten nitride barriers.

Conformal deposition of the liners 22, however, is very difficult with conventional processing. For example, physical vapor deposition (PVD), such as sputtering, of a metal layer (for adhesion, barrier and/or seed layer) requires at least about 50 Å over all surfaces of the trench 16 and contact via 20.

Unfortunately, PVD of metal into high aspect ratio voids necessitates much greater deposition on the top surfaces of the workpiece to produce adequate coverage of the via bottom. For example, typical state-of-the-art trench and contact structures for dual damascene schemes require about 500 Å PVD metal in order for 50 Å of metal to reach the bottom and sidewalls of the contact 20.

This poor step coverage is a result of the high aspect ratio of voids formed for dual damascene processing in today's integrated circuit designs. The aspect ratio of a contact via is defined as the ratio of depth or height to width. In the case of dual damascene contacts, the trench 16 and contact via 20 together reach through two levels of insulating layers 10, 12, such that the effective aspect ratio of the via 20 is very high.

Conventional deposition processes produce very poor step coverage (i.e., the ratio of sidewall coverage to field or horizontal surface coverage) of such high aspect ratio vias for a variety of reasons. Due to the directionality of PVD techniques, for example, deposition tends to accumulate more rapidly at upper corners 26 of the trench 16 and upper corners 28 of the via 20, as compared to the via bottom 30. As a result of the rapid build-up of deposited material the upper surfaces of the structure, the liners occupy much of the conductive line width in the trench 16 and even more, proportionately, of the contact via 20. These built-up corners 26, 28 then cast a shadow into the lower reaches of the structure, such that lower surfaces, and particularly lower corners, are sheltered from further deposition. Although PVD deposition can be directed more specifically to the via bottom, e.g., by collimation or by ionization of the depositing vapor, such additional directionality tends to sacrifice sidewall coverage.

Chemical vapor deposition (CVD) processes have been developed for certain metals and metal nitrides. CVD tends to exhibit better step coverage than PVD processes. In order for CVD processes to exhibit good step coverage, the reaction must be operated in the so-called "surface controlled" regime. In this regime, reaction species do not adhere to trench or via walls upon initial impingement. Rather, the species bounce off trench/via surfaces several times (e.g., 10-500 times) before reacting.

State-of-the-art CVD processes for depositing barrier layers at temperatures sufficiently low to be compatible with surrounding materials do not operate completely within the surface-controlled regime. Accordingly, even CVD processes, tend to deposit far less material at the bottom of a dual damascene contact 20 then on the upper surfaces and sidewalls of the structure. The upper corners of the trench 16 and the contact 20 represent a high concentration of surface area to volume. Deposition upon the horizontal upper surfaces and adjacent vertical sidewall surfaces merge together to result in an increased deposition rate near the corners 26, 28. Additionally, flowing reactants diffuse slowly into the confined spaces of the trench 16 and contact 20. Accordingly, the concentration of reactants reaching the via bottom 30 is far reduced relative to the concentration of reactants reaching upper surfaces of the structure. Thus, while somewhat improved relative to PVD, CVD step coverage of dual damascene structures remains uneven with most currently known low temperature CVD techniques.

In the pursuit of faster operational speeds and lower power consumption, dimensions within integrated circuits are constantly being scaled down. With continued scaling, the aspect ratio of contacts and trenches continues to increase. This is due to the fact that, while the width or horizontal dimensions of structures in integrated circuits continues to shrink, the thickness of insulating layers separating metal layers cannot be commensurately reduced. Reduction of the thickness in the insulating layers is limited by the phenomenon of parasitic capacitance, whereby charged carriers are slowed down or tied up by capacitance across dielectric layers sandwiched by conductive wires. As is known, such parasitic capacitance would become disabling if the insulating layer were made proportionately thinner as horizontal dimensions are scaled down.

With reference to FIG. 2, a scaled-down version of FIG. 1 is depicted, wherein like parts are referenced by like numerals with the addition of the suffix "a." As shown, continued scaling leads to a more pronounced effect of uneven step coverage while lining dual damascene structures. Material build-up at the corners 28*a* of the contact via 20*a* quickly reduces the size of the opening, even further reducing the concentration of reactants that reach into the contact via 20*a*. Accordingly, coverage of the via bottom surface 30*a* drops off even faster. Moreover, the percentage of the trench 16*a* occupied by the liner materials is much greater for the scaled down structure of FIG. 2. Since the lining material is typically less conductive than the subsequent filler metal (e.g., copper), overall conductivity is reduced. Worse yet, cusps at the corners 28*a* of the contact via can pinch off before the bottom 30*a* is sufficiently covered, or during deposition of the filler metal.

Accordingly, a need exists for more effective methods of lining trenches and vias in integrated circuits, particularly in the context of dual damascene metallization.

SUMMARY OF THE INVENTION

In satisfaction of this need, methods are provided herein for depositing lining materials into the high-aspect ratio trenches and contact vias of dual damascene metallization schemes. Advantageously, the methods attain high step coverage, such that only the minimum required thickness of the lining layer need be formed on all surfaces. Examples are provided for applying the methods to formation of one or more of adhesion, barrier and electroplating seed layers.

In general, the methods comprise cycles of alternating reactant phases, wherein each phase has a self-limiting effect. "Pure" metal layers, for example, can be formed by alternately adsorbing self-saturating halide- or organic-terminated metal monolayers and reducing the metal-containing monolayer. Metal nitrides suitable for conductive diffusion barriers can be formed by alternately adsorbing self-terminated metal-containing monolayers and conducting ligand exchange reactions, substituting nitrogen-containing species for halogen or organic tails on the metal-containing monolayers. Alternatively, the tails of the self-terminated metal-containing monolayer can be reduced or otherwise removed in an intermediate scavenger or getter phase prior to the nitrogen phase.

Advantageously, the methods enable forming uniformly thick conductive layers within high-aspect ratio openings (e.g., trenches and vias), desirably as thin as possible consistent with their respective functions. The remaining volume within such openings is thus maximized, facilitating a greater proportionate volume of more highly conductive filler materials, such as copper for metal runners and integral contacts.

BRIEF DESCRIPTION OF THE DRAWINGS

These and other aspects of the invention will be readily apparent to the skilled artisan in view of the description below, the appended claims, and from the drawings, which are intended to illustrate and not to limit the invention, and wherein:

DETAILED DESCRIPTION OF THE PREFERRED EMBODIMENT

Though described in the context of certain preferred materials, it will be understood, in view of the disclosure herein, that the methods and structures described herein will have application to a variety of other materials for lining damascene structures.

As discussed in the Background section above, lining damascene structures, and particularly dual damascene structures, by physical vapor deposition (PVD) and conventional chemical vapor deposition (CVD) disadvantageously fills a large volume of the trenches and contact vias. Accordingly, less room is left for the highly conductive filler material to follow. Use of a thinner liner material would leave more room for highly conductive filler metals such as copper which would, in turn, increase conductivity and operational signal transmission speeds for the integrated circuit. Conventional methods such as PVD and CVD, by their very nature, produce thicker layers towards the upper end of the damascene structure than at the bottom. While much research has been devoted to obtaining more conformal step coverage of dual damascene trenches and contact vias, it is very difficult to supply the same concentration of reactant species (or PVD sputtered material) to all surfaces of such structures. In particular, it is difficult to supply the same concentration of depositing species at the upper surfaces of such structures as supplied to the bottom of deep, confined contact vias that extend from the bottom of an already-deep trench.

By providing almost perfect step coverage, the preferred embodiments advantageously obtain the minimum necessary thickness for the desired liner layers over all surfaces of trenches and contact vias in a dual damascene structure. Desirably, the methods of the preferred embodiment are less dependent upon the relative concentration of reactant species in upper regions as compared to lower regions of the trench and contact via.

Figure 5:
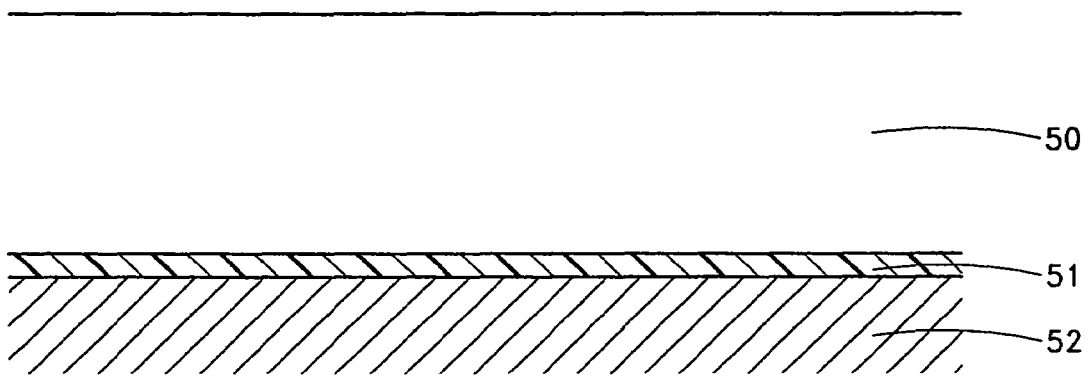
FIG. 5-13 are schematic cross-sections of a partially fabricated integrated circuit, generally illustrating the construction, lining and filling of a trench and via formed in insulating layers above a semiconductor substrate, in accordance with a preferred dual damascene process flow.
Figure 6:
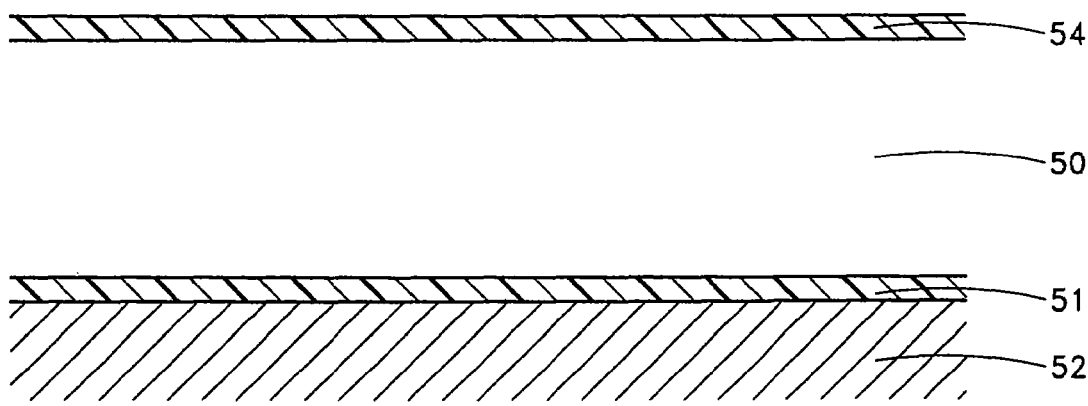
Figure 7:
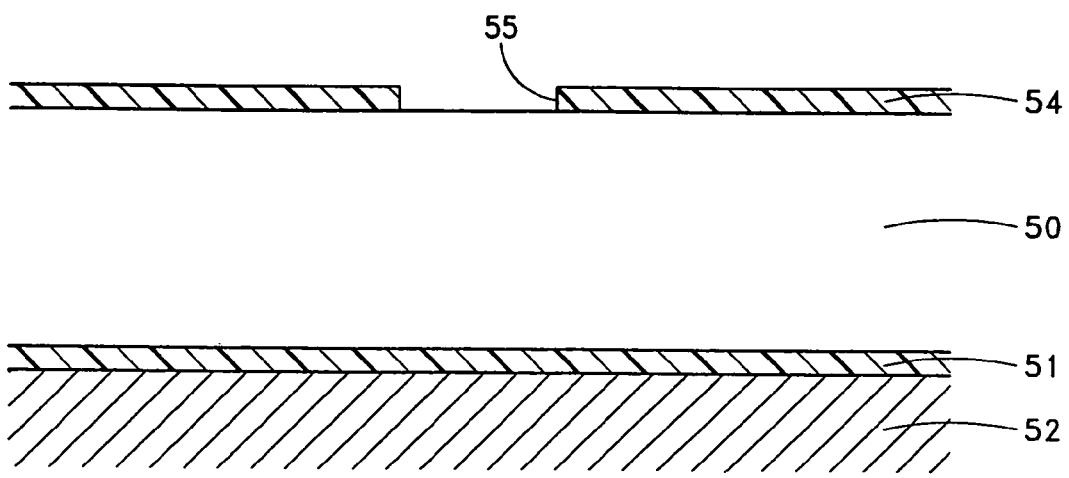
Figure 8:
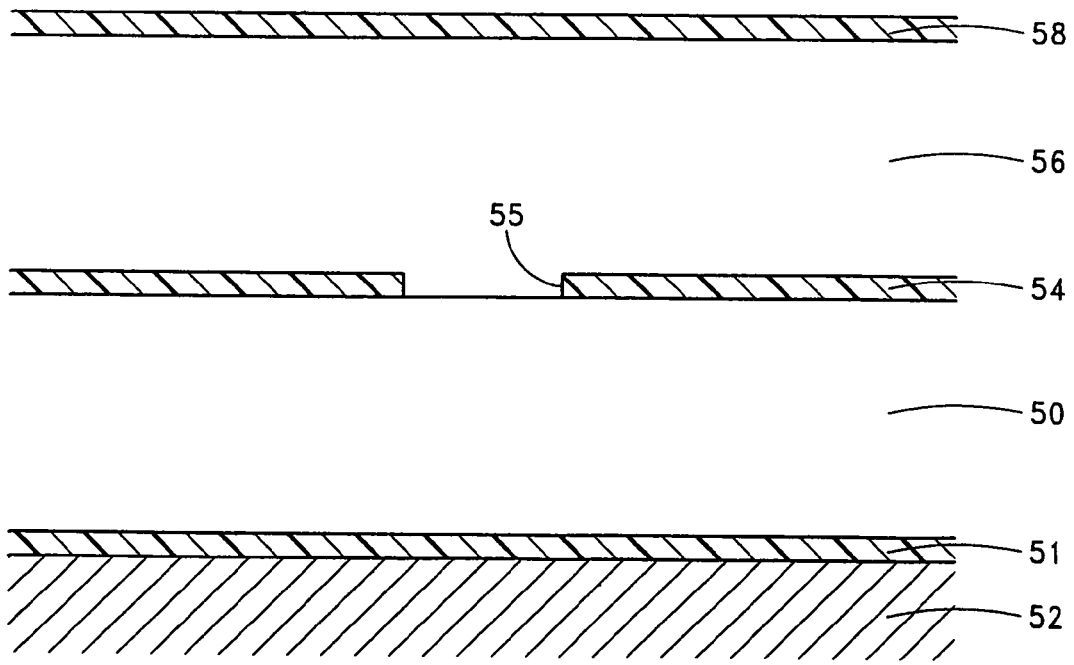

With reference to FIGS. 5-8, insulating layers are formed over a semiconductor substrate, in accordance with the preferred embodiments. Referring initially to FIG. 5, first or lower insulating layer 50 is formed over a barrier layer 51 and a conductive element 52, which forms part of a lower interconnect layer in the illustrated embodiment. As will be appreciated by the skilled artisan, metallization schemes typically employ one metal composition throughout various wiring layers (e.g., copper interconnects or aluminum interconnects). The preferred embodiments are adaptable to many different materials, but certain embodiments are particularly adapted to lining damascene structures wherein the via floor or lower conductive element 52 comprises a highly conductive copper line. The first insulating layer 50 is preferably formed to a thickness sufficient to insulate the lower conductive element 52 from upper wiring structures to be formed. An etch stop layer or hard mask 54 (FIGS. 6-7) is formed over the lower insulating layer 50 and a second or upper insulating layer 56 (FIG. 8) is formed over the etch stop layer 54. A second etch or CMP stop layer 58 (also known as a shield layer) is preferably also formed over the upper insulating layer 56.

In the illustrated embodiment, each of the lower and upper insulating layers 50, 56 comprise oxide deposited by plasma enhanced CVD employing tetraethlyorthosilicate a precursor. The insulating layers 50, 56 of the preferred material (referred to in the industry as "PECVD TEOS") are preferably provided with a thickness between about 0.3 µm and 1.5 µm, more preferably between about 0.5 µm and 1.0 µm. The skilled artisan will readily appreciate that the insulating layer can comprise any of a number of other suitable dielectric materials. For example, dielectric materials have recently been developed that exhibit low permittivity (low k), as compared to conventional oxides. These low k dielectric materials include polymeric materials, porous materials and fluorine-doped oxides. The present methods of lining trenches and contact vias will also have utility in conjunction with such low k materials.

The etch stop layers 54, 58 of the illustrated embodiment each comprise a material exhibiting different etch rates relative to the insulating layers 50, 56, allowing better control of etching processes. In the illustrated embodiment, the etch stop layers 54, 58 comprise silicon nitride ($Si_3N_4$), preferably provided to a thickness of between about 100 Å and 700 Å, and more preferably between about 200 Å and 500 Å. The lower barrier layer 51 preferably also comprises $Si_3N_4$.

As discussed in the Background section above, after the lower insulating layer 50 and etch stop 54 are formed (FIGS. 5 and 6), a mask and etch process transfers a pattern of openings 55 (one shown in FIG. 7) to the etch stop 54. The second or upper insulating layer 56 and optional CMP stop 58 are then formed over the hard mask 54.

Figure 9A:
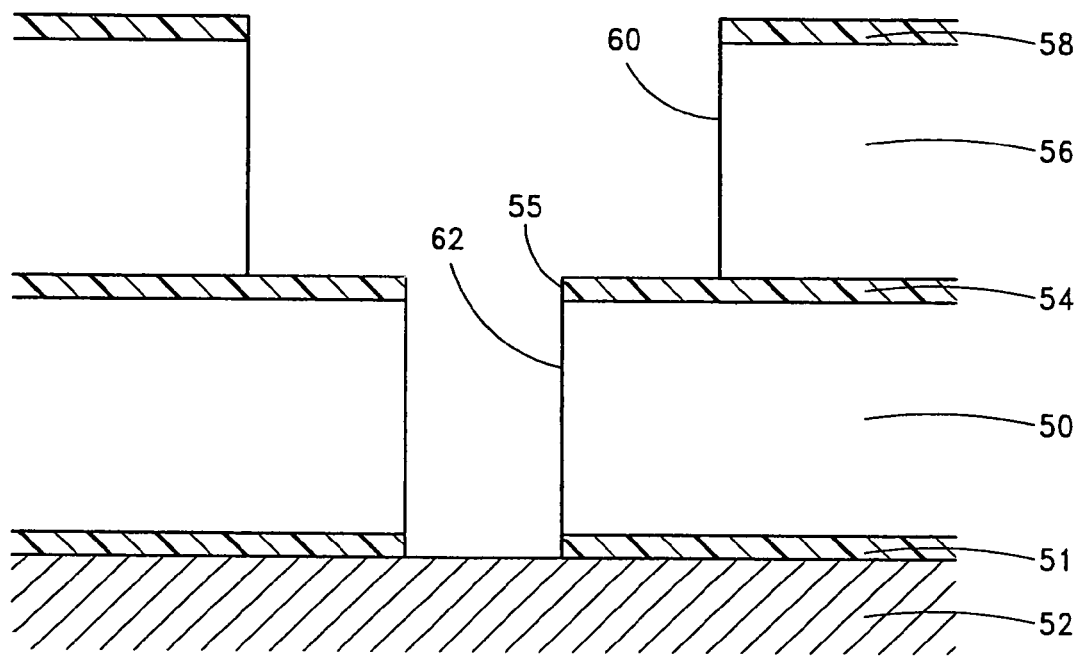

With reference now to FIG. 9A, the substrate is masked and trenches 60 (one shown) are etched through the upper insulating 56, preferably stopping on exposed portions of the first etch stop layer 54. As will be understood by the skilled artisan, the trenches 60 are etched across the insulating layer 56 in patterns desired for metal lines, in accordance with an integrated circuit design: In the illustrated embodiment, the width of the trench is less than about 0.35 µm and more preferably less than about 0.25 µm.

Continued etching through the hard mask 54 defines contact vias 62 (one shown) extending downwardly from the bottom of the trench and through the lower insulating layer 50 to expose conductive elements below (e.g., metal line 52). The contact vias 62 are defined by the openings 55 in the hard mask 54 at discrete locations along the trenches 60. Desirably, the contact vias 62 have a width of less than about 0.35 µm and more preferably between about 0.05 µm and 0.25 µm. The width or the diameter of a contact via 62 can be equal to or slightly less than the line width defined by the trench 60 above.

The effective aspect ratio (depth:width) of the contact via 62 is therefore preferably greater than about 2:1. Since the effective depth of the contact via 62 is defined through both insulating layers 50, 56, the effective aspect ratio is more preferably greater than about 3:1, and most preferably between about 4:1 and 8:1. The preferred embodiments will have particular utility in connection with future generation devices, whereby line widths and contact widths will shrink even further.

Figure 9B:
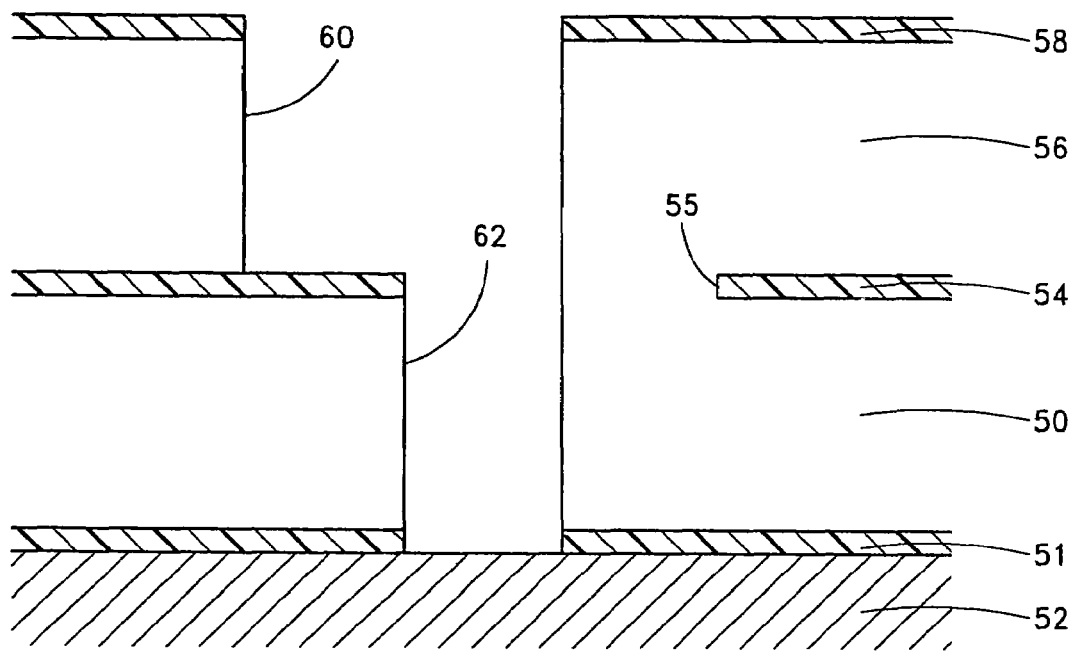
Figure 9C:
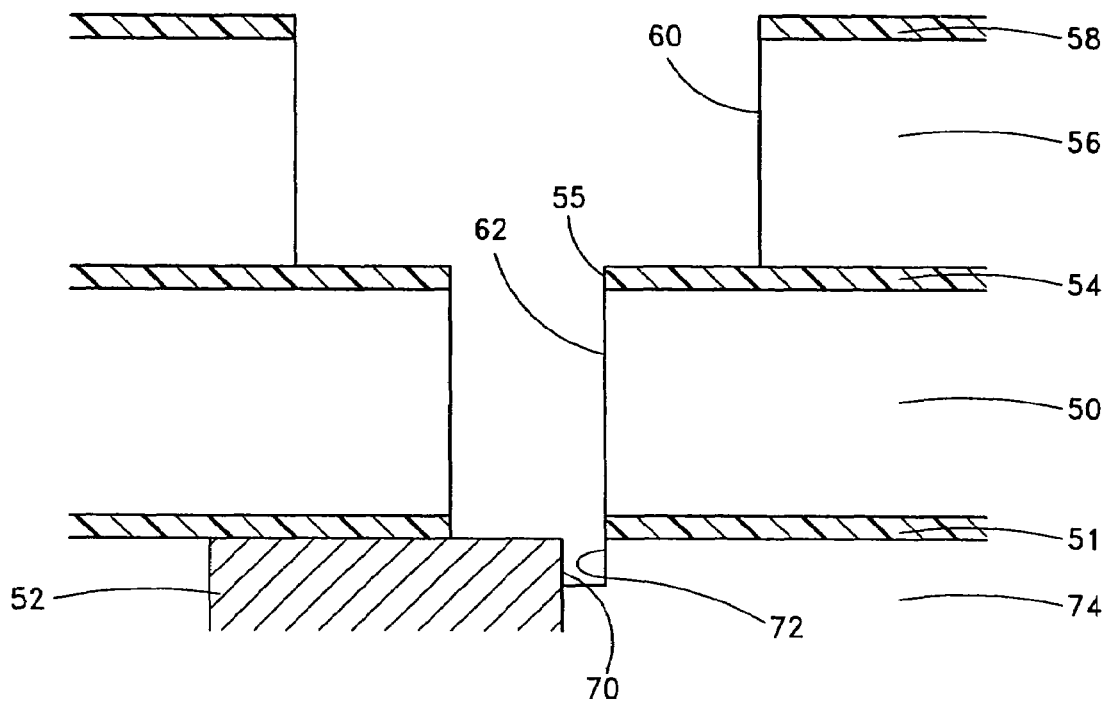
Figure 9D:
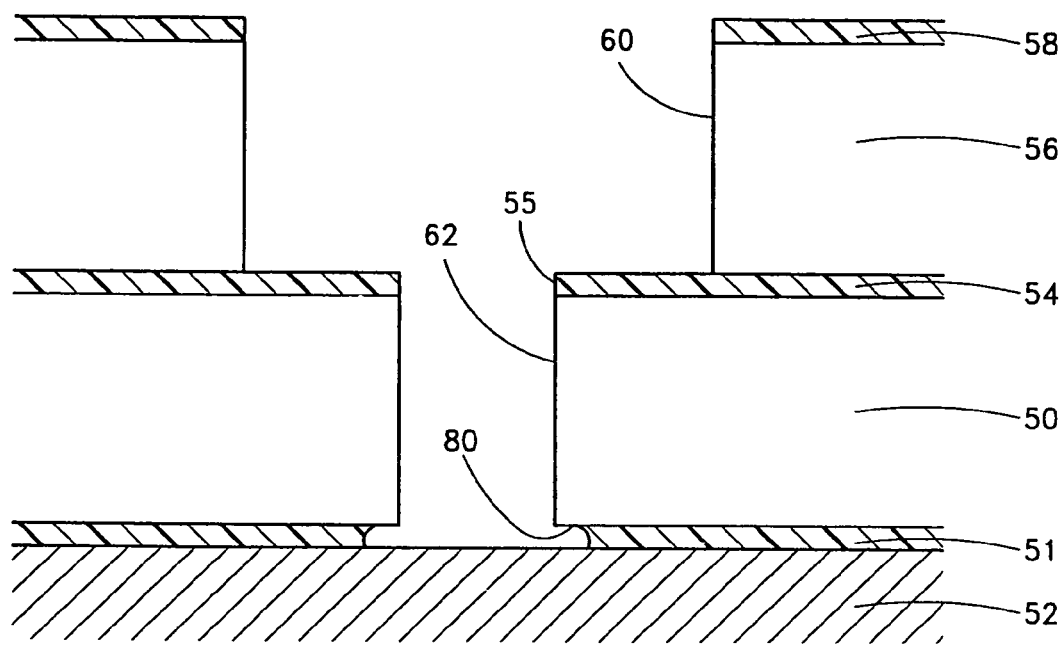

With reference to FIGS. 9B to 9D, the preferred embodiments also have particular utility in conjunction with variations on the dual damascene structure of FIG. 9A. Parts similar to those of FIG. 9A will be referred to by like reference numerals.

Referring to FIG. 9B, a non-capped dual damascene structure is shown. When non-capped vias 62 are allowed by design rules (and they are desirable for obtaining higher circuit densities), mask misalignment can lead to even greater aspect ratios. As one via sidewall is withdrawn from the corresponding edge of the opening 55 defined by the hard mask 54, the effective contact size decreases, such that aspect ratios can easily be double those listed above for the illustrated embodiment of FIG. 9A.

Referring now to FIG. 9C, vias that are not fully landed similarly exhibit higher effective aspect ratios. Under such circumstances, the opening 55 of the hard mask 54 overlaps with an edge 70 of the conductive circuit element 52. Small but very high aspect ratio overetch holes 72 are formed in an insulating or dielectric layer 74 surrounding the circuit element 52. The depth of the overetched hole 72 will depend, of course, on the etch selectivity between the barrier layer 51 and the surrounding dielectric 74.

FIG. 9D illustrates the effect of undercutting the barrier layer 51 during via etch. When the barrier 51 is etched by a selective etch from the via bottom to expose the underlying circuit element 52, the barrier 51 tends to be laterally recessed. The resultant cavities 80 are very difficult to line by conventional processes.

Figure 9E:
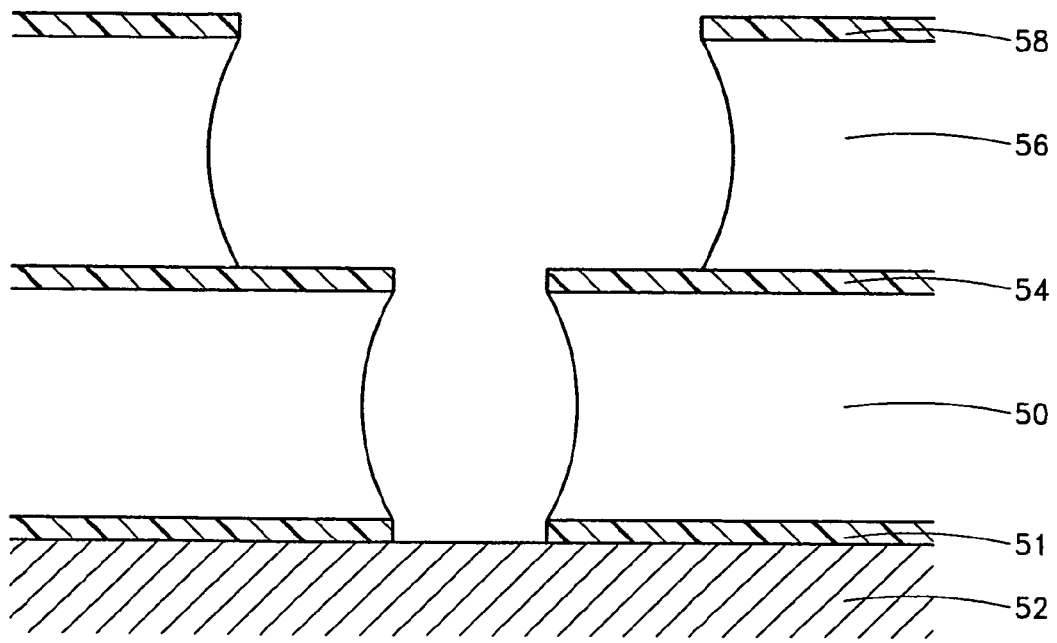

FIG. 9E illustrates yet another non-ideal damascene structure. When removing photoresist employed to pattern the structure, insulating layers 50, 56 formed of low k dielectrics are susceptible to attack, leaving a barrel-shaped profile in the trench 60 and via 61. This structure is also difficult to effectively line and fill by conventional processing.

Similarly, many other non-ideal conditions can result in other re-entrant profiles, cavities and/or extremely high aspect ratios for dual damascene trenches and vias. Under such circumstances, conventional processing is inadequate for lining and filling these structures without forming voids. The methods of the preferred embodiments, in contrast, can effectively line even the aberrant structures of FIGS. 9B to 9E. Moreover, the skilled artisan will readily find application for the methods and films disclosed herein beyond the dual damascene context. For example, the methods disclosed herein can also be used effectively for lining trenches in single damascene wiring schemes or for lining conventional contact vias and openings. The methods of lining have particular utility in conjunction with the dual damascene process flows of the preferred embodiments.

Methods of Forming Conformal Liners

The damascene structure so formed is thereafter lined with high step coverage. In accordance with the preferred embodiments, liners are formed by a periodic process in which each cycle deposits, reacts or adsorbs a layer upon the workpiece in a self-limiting manner. Preferably, each cycle comprises at least two distinct phases, wherein each phase is a saturative reaction with a self-limiting effect, leaving no more than about one atomic monolayer of the desired liner material.

Figure 1:
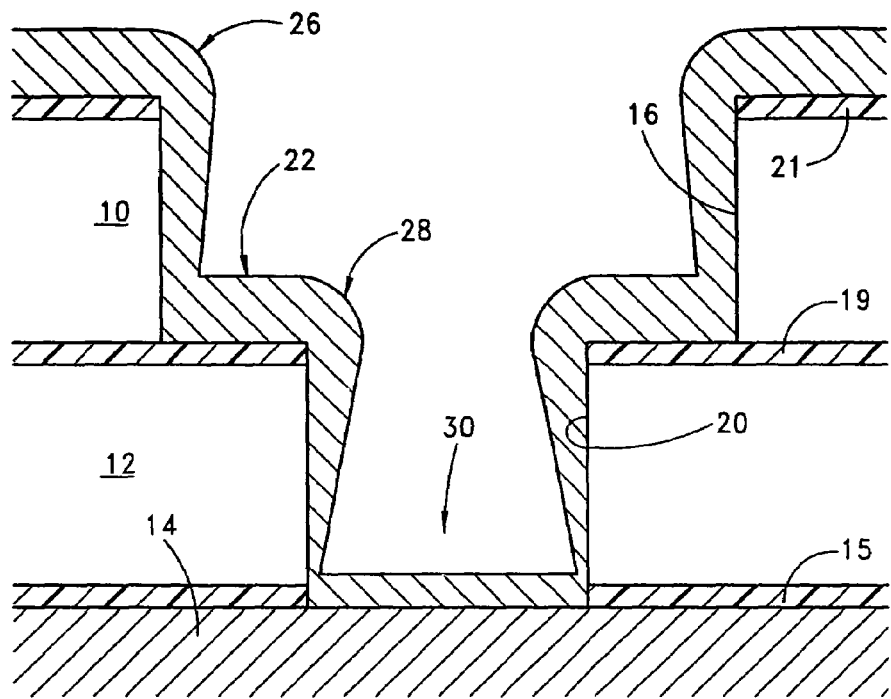
FIG. 1 is a schematic cross-section of a dual damascene structure having a conventional barrier layer lining the trench and contact via thereof.
Figure 2:
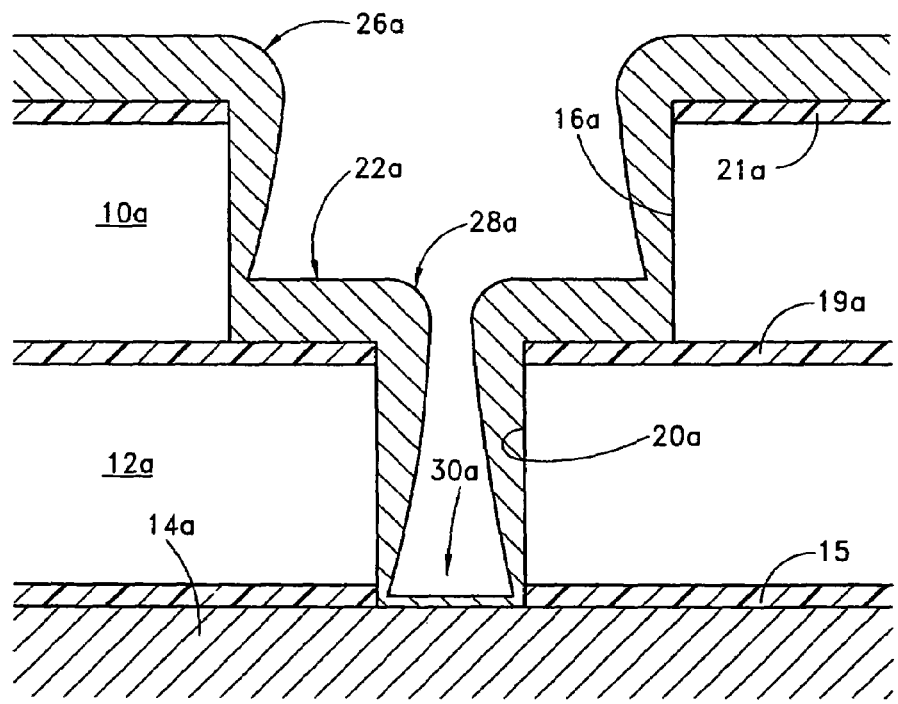
FIG. 2 generally illustrates a lined dual damascene structure, similar to FIG. 1, for a scaled-down integrated circuit.
Figure 3:
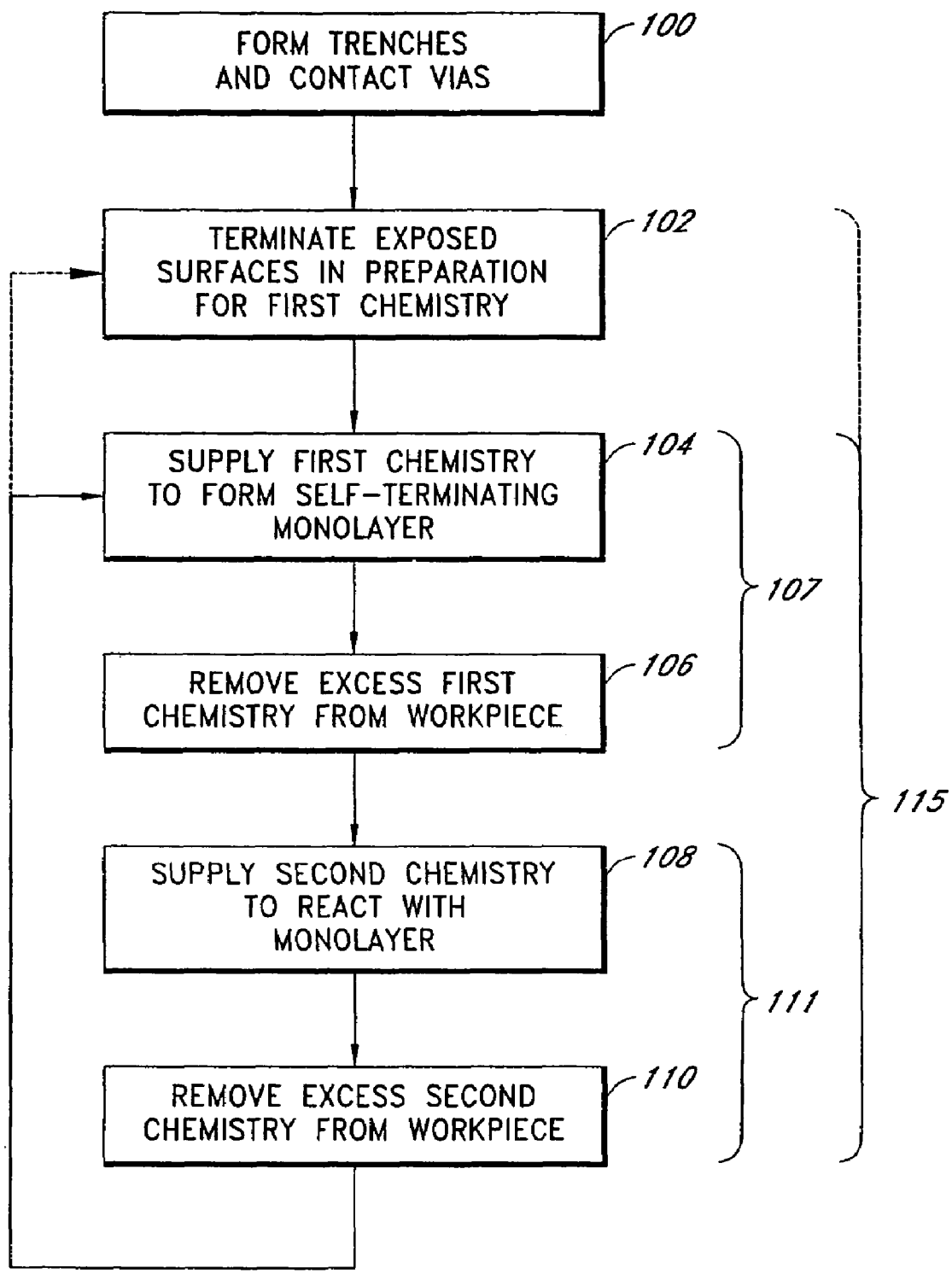
FIG. 3 is a flow chart generally illustrating a method of lining high aspect ratio, dual damascene structures prior to filling with a more highly conductive material.

FIG. 3 generally illustrates a method of forming damascene lining layers with high step coverage. The preferred method is a form of atomic layer deposition (ALD), whereby reactants are supplied to the workpiece in alternating pulses in a cycle. Preferably, each cycle forms no more than about one monolayer of lining material by adsorption and preferably by chemisorption. The substrate temperature is kept within a window facilitating chemisorption. In particular, the substrate temperature is maintained at a temperature low enough to maintain intact bonds between adsorbed species and the underlying surface, and to prevent decomposition of the reactant species. On the other hand, the substrate temperature is maintained at a high enough level to avoid condensation of reactants and to provide the activation energy for the desired surface reactions in each phase. Of course, the appropriate temperature window for any given ALD reaction will depend upon the surface termination and reactant species involved.

Each pulse or phase of each cycle is preferably self-limiting in effect. In the examples set forth below, each of the phases are self-terminating (i.e., an adsorbed and preferably chemisorbed monolayer is left with a surface non-reactive with the chemistry of that phase). An excess of reactant precursors is supplied in each phase to saturate the structure surfaces. Surface saturation ensures reactant occupation of all available reactive sites (subject to physical size restraints, as discussed in more detail below), while self-termination prevents excess film growth at locations subject to longer exposure to the reactants. Together, saturation and self-terminating chemistries ensure excellent step coverage.

As illustrated, the process in accordance with the preferred embodiments begins with formation 100 of a dual damascene structure, such as those illustrated in FIGS. 9A to 9D and discussed above.

If necessary, the exposed surfaces of the dual damascene structure (e.g., the trench and via sidewall surfaces and the metal floor shown in FIG. 9A, or surfaces of a previously deposited adhesion layer) are terminated 102 to react with the first phase of the ALD process. The first phases of the preferred embodiments (see Tables I to IV) are reactive, for example, with hydroxyl (OH) or ammonia ($NH_3$) termination. In the examples discussed below, silicon oxide and silicon nitride surfaces of the dual damascene structure do not require a separate termination. Certain metal surfaces, such as at the bottom of the via 61 (FIG. 9A), can be terminated, for example, with ammonia treatment. Where the lining material to be deposited is a metal nitride, surface termination can be considered to include formation of an initial adhesion layer and surface termination thereof, as discussed in more detail with respect to Table I below, possibly with an additional surface termination treatment of the adhesion layer.

After initial surface termination 102, if necessary, a first chemistry is then supplied 104 to the workpiece. In accordance with the preferred embodiments, discussed in more detail below with respect to FIG. 4, the first chemistry comprises a metal-containing compound that is reactive with the terminated surfaces left by the previous step 102. Accordingly, a metal-containing species replaces or adsorbs upon the surface termination. This metal-containing species layer is desirably self-terminating, such that any excess constituents of the first chemistry do not further react with the monolayer formed by this process. Preferably a halide or organic ligand terminates the metal-containing monolayer.

The metal-containing reactive species is preferably supplied in gaseous form, and is accordingly referred to hereinbelow as a metal gas source. In some examples, the reactive species actually has a melting point above the process temperature (e.g., in Table V below, CuCl melts at 430° C. while the process is conducted at about 350° C.). Nevertheless, the metal source gas is considered "volatile," for purposes of the present description, if the species exhibits sufficient vapor pressure under the process conditions to transport the species to the workpiece in sufficient concentration to saturate exposed surfaces.

The first chemistry is then removed 106 from the reaction chamber. In the illustrated embodiments, step 106 merely entails stopping the flow of the first chemistry while continuing to flow a carrier gas for a sufficient time to diffuse or purge excess reactants and reactant by-products out of the vias, trenches and the reaction chamber, preferably with greater than about two reaction chamber volumes of the purge gas, more preferably with greater than about three chamber volumes. In the illustrated embodiment, the removal 106 comprises continuing to flow purge gas for between about 0.1 seconds and 20 seconds after stopping the flow of the first chemistry. Inter-pulse purging is described in co-pending U.S. patent application having Ser. No. 09/392,371, filed Sep. 8, 1999 and entitled IMPROVED APPARATUS AND METHOD FOR GROWTH OF A THIN FILM, the disclosure of which is incorporated herein by reference. In other arrangements, the chamber may be completely evacuated between alternating chemistries. See, for example, PCT publication number WO 96/17107, published Jun. 6, 1996, entitled METHOD AND APPARATUS FOR GROWING THIN FILMS, the disclosure of which is incorporated herein by reference. Together, the adsorption 104 and reactant removal 106 represent a first phase in an ALD cycle.

When the reactants of the first chemistry have been removed 106 from the chamber, a second chemistry is supplied 108 to the workpiece. The second chemistry desirably reacts with the self-terminated monolayer formed in step 104. In the illustrated embodiments, described in more detail below with respect to FIG. 4, this reaction comprises supplying a nitrogen source gas to the workpiece. Nitrogen or nitrogen-containing species from the nitrogen source gas preferably reacts with the previously adsorbed metal-containing species to leave a metal nitride in place of the metal-containing monolayer.

In other arrangements, the second chemistry may simply scavenge or remove the ligand termination of the adsorbed metal complex monolayer formed in step 104 (e.g., by ligand-exchange, sublimation or reduction) or otherwise prepare the monolayer for deposition/adsorption of a further monolayer and/or reaction with a further chemistry (see, e.g., Tables I, IV and V below). Desirably, the reaction 108 is also self-limiting. Reactants saturate the limited number of reaction sites left by step 104. Temperature and pressure conditions are preferably arranged to avoid diffusion of reactants from the second chemistry through the monolayer to underlying materials. The second chemistry also leaves a surface termination that operates to limit the deposition in a saturative reaction phase. In the illustrated embodiments of Tables II and III below, nitrogen and $NH_x$ tails terminating a metal nitride monolayer are non-reactive with $NH_3$ of the second chemistry.

After a time period sufficient to completely saturate and react the metal-containing monolayer with the second chemistry, the second chemistry is removed 110 from the workpiece. As with the removal 106 of the first chemistry, this step 110 preferably comprises stopping the flow of the second chemistry and continuing to flow carrier gas for a time period sufficient for excess reactants and reaction by-products from the second chemistry to diffuse out of the vias and trenches of the damascene structure and be purged from the reaction chamber. For example, reactants and reaction by-products can be removed by flowing purge gas after stopping the flow of the first chemistry, preferably with at least about two chamber volumes of purge gas and more preferably with at least about three chamber volumes. In the illustrated embodiment, the removal 110 comprises continuing to flow purge gas for between about 0.1 seconds and 20 seconds after stopping the flow of the first chemistry. Together, the reaction 108 and removal 110 represent a second phase 111 in an ALD cycle.

In the illustrated embodiment, where two phases are alternated once the excess reactants and by-products of the second chemistry have diffused out of the vias and trenches, and preferably out of the reaction chamber, the first phase of the ALD process is repeated. Accordingly, again supplying 104 the first chemistry to the workpiece forms another self-terminating monolayer.

The two phases 107, 111 thus represent a cycle 115 repeated to form monolayers in an ALD process. The first chemistry generally reacts with the termination left by the second chemistry in the previous cycle. If necessary, the cycle 115 can be extended to include a distinct surface preparation, similar to step 102, as shown in dotted lines in FIG. 3. The cycle 115 then continues through steps 104 to 110. This cycle 115 is repeated a sufficient number of times to produce a lining layer within the dual damascene structure of a thickness sufficient to perform its desired function.

Though illustrated in FIG. 3 with only first and second chemistries, it will be understood, that, in other arrangements, additional chemistries can also be included in each cycle (see, e.g., Table IV below). Furthermore, though illustrated with an initial metal phase and subsequent nitrogen phase in the examples below, it will be understood that the cycle can begin with the nitrogen phase, depending upon the surfaces and phase chemistries.

Forming Metal Adhesion Liners

Depending upon the exposed materials and desired ALD chemistry, an adhesion layer prior to formation of a barrier diffusion may or may not be desired. With TEOS oxides, the inventors have not found the use of an adhesion layer necessary. On the other hand, adhesion layers may be desirable for vias and trenches formed in alternative insulating materials, such as spin-on dielectrics and low k materials. Conductive adhesion layers may also be desirable to facilitate reaction of the first phase over metal runners or landing pads 52 exposed at the bottom of the via 61 (FIG. 9A).

If an adhesion layer is desired, the adhesion layer preferably comprises a "pure" metal lining layer over oxide, metal and etch stop layers of the dual damascene structures. Prior to forming the preferred barrier layers, therefore, a dual damascene structure similar to those of FIGS. 9A to 9E is preferably lined with a metal adhesion layer. As is known in the art, such adhesion layers can be formed by PVD or CVD. For example, PVD titanium and CVD tungsten processes are well known in the art.

More preferably, the adhesion layer is formed by ALD, as exemplified by the process recipe of Table I below. It will be understood that the principles disclosed herein with respect to FIG. 3, and with respect to the particular examples of metal nitrides set forth below, are applicable to the formation of a variety liner materials. For example, a pure metal layer can be deposited by alternately depositing halogen- or organic-terminated monolayers of metal and flowing reduction agents (e.g., H radicals, triethyl boron or other strong reducers) to remove the halogen termination. Removal of the metal monolayer termination by binding and carrying the ligand away can be more generally referred to as "gettering" or "scavenging" the ligand. In the next cycle, therefore, the metal source gas can adsorb upon the underlying metal monolayer in another self-terminating phase. The resultant ALD metal is particularly useful as an adhesion layer prior to barrier layer deposition, and as a seed layer following barrier deposition and preceding electroplating.

Accordingly, one of the reactant species preferably includes a metal-containing species with an organic or halide ligand. Exemplary metal precursors include tantalum pentaethoxide, tetrakis(dimethylamino)titanium, pentakis(dimethylamino)tantalum, $TaCl_5$ and $TiCl_4$. In the illustrated embodiment, a tungsten (W) seed layer is formed by ALD, in alternating metal and reducing phases separated by purge steps. In the process recipe of Table I below, tungsten hexafluoride ($WF_6$) is alternated with a scavenger in the form of the reducing agent triethyl boron (($CH_3CH_2$)$_3$B) or TEB.

TABLE I

| Phase | Carrier Flow (slm) | Reactant | Reactant Flow (sccm) | Temperature (° C.) | Pressure (Torr) | Time (sec) |
|---|---|---|---|---|---|---|
| metal | 600 | $WF_6$ | 50 | 400 | 10 | 0.25 |
| purge | 600 | — | — | 400 | 10 | 0.5 |
| reduce | 600 | TEB | 40 | 400 | 10 | 0.1 |
| purge | 600 | — | — | 400 | 10 | 0.8 |

Radicals provided by plasma generators can facilitate deposition of metal-containing layers at the low temperatures of ALD processing. Structures and methods of depositing metals and metal-containing layers with radical enhancement are provided in patent application having Ser. No. 09/392,371, filed Sep. 8, 1999 and entitled IMPROVED APPARATUS AND METHOD FOR GROWTH OF A THIN FILM, the disclosure of which is incorporated by reference hereinabove. Another exemplary ALD metal process flow is provided in U.S. Pat. No. 5,916,365 to Sherman, issued Jun. 29, 1999, the disclosure of which is incorporated herein by reference.

Methods of Forming Metal Nitride Barrier Liners

Figure 4:
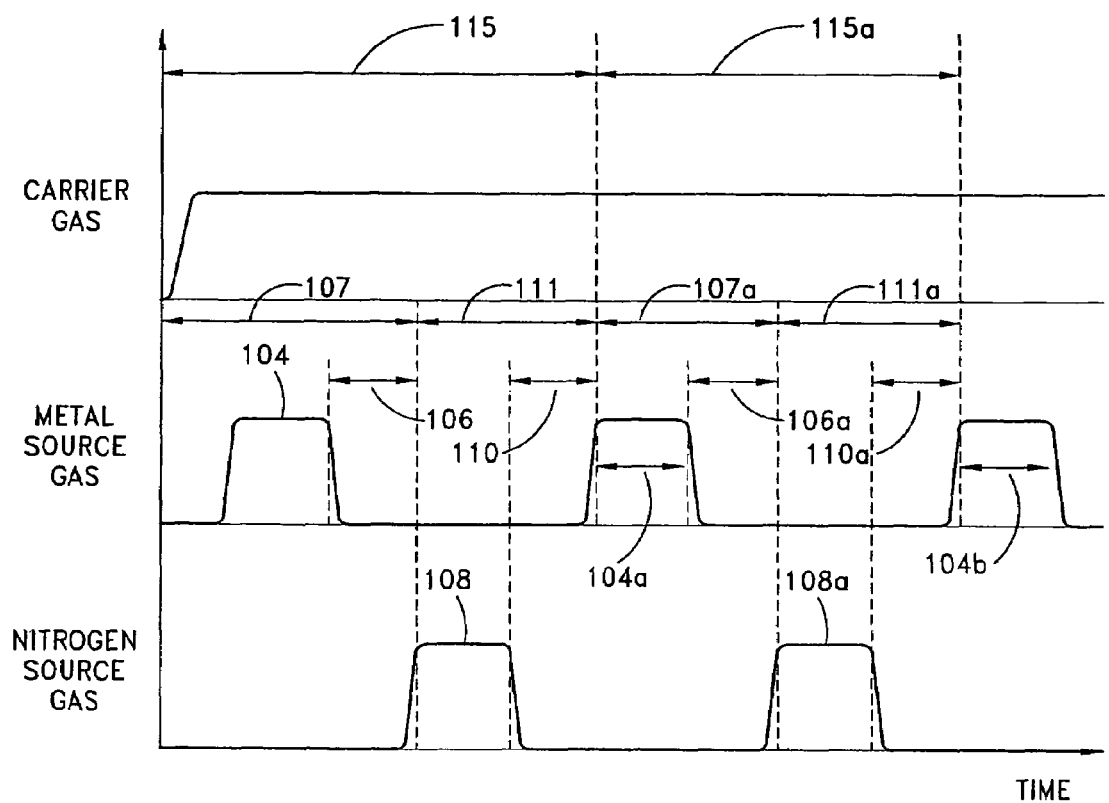
FIG. 4 is an exemplary gas flow diagram for depositing a barrier layer, in accordance with a preferred embodiment of the present invention.

FIG. 4 and Tables II to IV below illustrate exemplary processes for forming metal nitride barrier layers lining the structures of FIGS. 9A to 9E. For simplicity, like reference numerals are employed to refer to the phases and steps of the metal nitride examples (FIG. 4) that correspond to the general description of FIG. 3.

With reference now to FIG. 4, a gas flow sequence is represented in accordance with a particular embodiment. In the illustrated example, a conductive nitride, and more particularly a metal nitride, is formed by supplying the workpiece with a metal source gas alternately with a nitrogen source gas. The first or metal phase 107 of each cycle chemisorbs a layer of metal-containing material, desirably in the absence of the nitrogen source gas. The second or nitrogen phase 111 of each cycle reacts or adsorbs a nitrogen-containing material on the deposited metal-containing layer, desirably in the absence of the metal source gas. It will be understood that, in other arrangements, the order of the phases can be reversed, and that the reactant removal or purge steps can be considered part of the preceding or subsequent reactant pulse.

Surfaces of the damascene structure upon which the lining material is to be formed are initially terminated to provide a surface that is reactive with the metal source gas. In the embodiment of FIG. 9A, the exposed surfaces upon which deposition is desired include sidewalls of the insulating layers 50, 56 (TEOS in the illustrated embodiment), exposed etch stop layers 54, 58 and the floor of the contact via 62 defined by the lower conductive element 52 (copper in the illustrated embodiment). These surfaces are preferably prepared for barrier layer formation by deposition of an adhesion layer, desirably by ALD metal deposition, as discussed above, and a further treatment of the metal adhesion layer with $NH_3$, for example. Without an adhesion layer, reactants of the metal phase 107 can chemisorb upon the oxide and nitride surfaces of the preferred damascene structure without separate surface termination. Depending upon the chemistry of the metal phase 107, a surface treatment of the exposed metal runner 52 can be provided (e.g., with $NH_3$).

Most preferably, the metal phase 107 is self-limiting, such that no more than about one atomic monolayer is deposited during the first phase. Desirably, a volatile metal source gas is provided in a pulse 104. Exemplary metal source gases include titanium tetrachloride ($TiCl_4$), tungsten hexafluoride ($WF_6$), tantalum pentachloride ($TaCl_5$), tantalum pentaethoxide, tetrakis(dimethylamino)titanium, pentakis(dimethylamino)tantalum, copper chloride (CuCl) and copper hexafluoroacetylacetonate vinyltrimethylsilane (Cu(HFAC) VTMS).

After a sufficient time for the metal source gas to diffuse into the bottom of the dual damascene contact via, shutting off the flow of the metal source gas ends the metal pulse 104. Preferably, carrier gas continues to flow in a purge step 106 until the metal source gas is purged from the chamber.

During the pulse 104, the metal source gas reacts with exposed and terminated surfaces of the workpiece to deposit or chemisorb a "monolayer" of metal-containing species. While theoretically the reactants will chemisorb at each available site on the exposed layer of the workpiece, physical size of the adsorbed species (particularly with terminating ligands) will generally limit coverage with each cycle to a fraction of a monolayer. In the example of Table II, the ALD process grows metal nitride layers at roughly 0.35 Å/cycle, such that a full monolayer effectively forms from material deposited approximately every 15 cycles for TiN, which has a bulk lattice parameter of about 4.2 Å. Each cycle is represented by a pair of metal source gas and nitrogen source gas pulses. "Monolayer," as used herein, therefore refers to a fraction of a monolayer during deposition, referring primarily to the self-limiting effect of the pulse 104.

In particular, the metal-containing species deposited/adsorbed upon the workpiece is self-terminating such that the surface will not further react with the metal source gas. In the examples set forth below, $TiCl_4$ (Table II) leaves a monolayer of chloride-terminated titanium. $WF_6$ (Tables III and IV) leaves a monolayer of fluorine-terminated tungsten. Similarly, other volatile metal halides will leave halide-terminated surfaces, and metal organics, such as tantalum pentaethoxide, tetrakis(dimethylamino)titanium, and pentakis(dimethylamino)tantalum, will leave surface terminated with organic ligands. Such surfaces do not further react with the metal source or other constituents of the reactant flow during the metal source gas pulse 104. Because excess exposure to the reactants does not result in excess deposition, the chemistry during the metal phase 107 of the process is said to be self-limiting. Despite longer exposure to a greater concentration of reactants, deposition on upper surfaces of the workpiece does not exceed deposition on the via floor.

In a second phase 111 of the cycle 115, a pulse 108 of a nitrogen source gas is then provided to the workpiece. In the illustrated examples, the nitrogen source gas comprises ammonia. Preferably, the second phase 111 is maintained for sufficient time to fully expose the monolayer of metal-containing species left by the first phase 107 to the nitrogen source gas. After a sufficient time for the nitrogen source gas to diffuse into the bottom of the dual damascene contact via, shutting off the flow of the metal source gas ends the nitrogen pulse 108. Preferably, carrier gas continues to flow in a purge step 110 until the nitrogen source gas is purged from the chamber.

During the nitrogen pulse 108, the nitrogen source gas reacts with or chemisorbs upon the self-terminated metal monolayer left by the first phase 107. In the embodiments of Tables II and III, this chemisorption comprises a saturative ligand-exchange reaction, replacing the halogen termination of the metal monolayer with a nitrogen-containing species. In the embodiment of Table IV, in contrast, an intermediate getter or scavenging phase first removes the halogen termination of the metal monolayer prior to a nitrogen pulse. In this case, in a third phase the nitrogen-containing species reacts with adsorbs upon the metal left exposed by the getter phase. In either case, a metal nitride is thereby formed, preferably in a single monolayer. Desirably, the process leaves a stoichiometric metal nitride. As discussed with respect to the metal phase 107, the monolayer need not occupy all available sites, due the physical size of the adsorbed species. However, the second phase 111 also has a self-limiting effect.

In particular, the nitrogen source gas reacts with the metal-containing species chemisorbed onto the workpiece surface during the previous pulse of metal source gas. The reaction is also surface terminated, since ammonia during the pulse 108 will not react with nitrogen and $NH_x$ tails terminating the metal nitride monolayer. Moreover, temperature and pressure conditions are arranged to avoid diffusion of ammonia through the metal monolayer to underlying materials. Despite longer exposure to a greater concentration of reactants in this saturative, self-limiting reaction phase 111, the thickness of the metal nitride formed on upper surfaces of the workpiece does not exceed the thickness of the metal nitride formed on the via floor.

The metal phase 107 (including metal source pulse 104 and purge 106) and nitrogen phase 108 (including nitrogen source pulse 108 and purge 110) together define a cycle 115 that is repeated in an ALD process. After the initial cycle 115, a second cycle 115a is conducted, wherein a metal source gas pulse 104a is again supplied. The metal source gas chemisorbs a metal-containing species on the surface of the metal nitride formed in the previous cycle 115. The metal-containing species readily react with the exposed surface, depositing another monolayer or fraction of a monolayer of metal-containing species and again leaving a self-terminated surface that does not further react with the metal source gas. Metal source gas flow 104a is stopped and purged 106a from the chamber, and (according to Tables II and III) a second phase 111a of the second cycle 115a provides nitrogen source gas to nitridize the second metal monolayer. According to the example of Table IV, the nitrogen phase is preceded by an intermediate getter or scavenging phase.

The cycle 115a is repeated at least about 10 times, and more preferably at least about 20 times, until a sufficiently thick metal nitride is formed to serve a barrier function in the dual damascene structure. Advantageously, layers having a thickness of less than about 200 Å, and more preferably less than about 100 Å, can be formed with near perfect step coverage by the methods of the preferred embodiments.

EXAMPLES

The tables below provide exemplary process recipes for forming metal nitride layers suitable for barrier applications in dual damascene metallization schemes for ultra large scale integrated processing. Each of the process recipes represents one cycle in a single-wafer process module. In particular, the illustrated parameters were developed for use in the single-wafer ALD module commercially available under the trade name Pulsar 2000™, available commercially from ASM Microchemistry Ltd. of Finland.

Note that the parameters in the tables below (and also in Table I above) are exemplary only. Each process phase is desirably arranged to saturate the via and trench surfaces. Purge steps are arranged to remove reactants between reactive phases from the vias. The examples herein have been conducted upon planar, unpatterned wafer surfaces in a Pulsar 2000™ reaction chamber, from ASM Microchemistry Ltd. of Finland. Similar ALD processes have been determined to achieve better than 90% step coverage in voids with aspect ratios of greater than about 20. In view of the disclosure herein, the skilled artisan can readily modify, substitute or otherwise alter deposition conditions for different reaction chambers and for different selected conditions to achieve saturated, self-terminating phases at acceptable deposition rates.

Advantageously, the ALD processes described herein are relatively insensitive to pressure and reactant concentration, as long as the reactant supply is sufficient to saturate the trench and via surfaces. Furthermore, the processes can operate at low temperatures Workpiece temperature is preferably maintained throughout the process between about 300° C. and 500° C. to achieve relatively fast deposition rates while conserving thermal budgets during the back-end process. More preferably, the temperature is maintained between about 350° C. and 400° C., and most preferably between about 380° C. and 400° C. Pressure in the chamber can range from the milliTorr range to super-atmospheric, but is preferably maintained between about 1 Torr and 500 Torr, more preferably between about 10 Torr and 100 Torr.

TABLE II

| Phase | Carrier Flow (slm) | Reactant | Reactant Flow (sccm) | Temperature (° C.) | Pressure (Torr) | Time (sec) |
|---|---|---|---|---|---|---|
| metal | 400 | TiCl$_4$ | 20 | 400 | 10 | .05 |
| purge | 400 | — | — | 400 | 10 | 0.8 |
| nitrogen | 400 | NH$_3$ | 100 | 400 | 10 | 0.75 |
| purge | 400 | — | — | 400 | 10 | 1.0 |

Table II above presents parameters for ALD of a titanium nitride (TiN) barrier into trenches and contact vias of a dual damascene structure. As noted, the metal source gas comprises titanium tetrachloride (TiCl$_4$), the carrier gas comprises nitrogen (N$_2$) and the nitrogen source gas preferably comprises ammonia (NH$_3$).

In the first phase of the first cycle, TiCl$_4$ chemisorbs upon the oxide, nitride, metal and/or OH— or NH$_x$-terminated surfaces of the dual damascene trenches and contact vias. The metal source gas preferably comprises a sufficient percentage of the carrier flow, given the other process parameters, to saturate the damascene surfaces. A monolayer of titanium complex is left upon the trench and via surfaces, and this monolayer is self-terminated with chloride.

Desirably, the reactor includes a catalyst to convert the metal source gas to a smaller and/or more reactive species. In the illustrated embodiment, the preferred reaction chamber comprises titanium walls, which advantageously convert TiCl$_4$ to TiCl$_3{}^+$. The smaller species readily diffuse into vias, occupy more reactive sites per cycle and more readily chemisorb onto the active sites. Accordingly, the catalyst enables faster deposition rates. The skilled artisan will readily appreciate that other catalysts can be employed for other chemistries.

After the TiCl$_4$ flow is stopped and purged by continued flow of carrier gas, a pulse of NH$_3$ is supplied to the workpiece. Ammonia preferably comprises a sufficient percentage of the carrier flow, given the other process parameters, to saturate the surface of the metal-containing monolayer. The NH$_3$ readily reacts with the chloride-terminated surface of the metal monolayer in a ligand-exchange reaction, forming a monolayer of titanium nitride (TiN). The reaction is limited by the number of available metal chloride complexes previously chemisorbed. Neither ammonia nor the carrier gas further reacts with the resulting titanium nitride monolayer, and the monolayer is left with a nitrogen and NH$_x$ bridge termination. The preferred temperature and pressure parameters, moreover, inhibit diffusion of ammonia through the metal monolayer.

In the next cycle, the first phase introduces TiCl$_4$, which readily reacts with the surface of the titanium nitride monolayer, again leaving a chloride-terminated titanium layer. The second phase of the second cycle is then as described with respect to the first cycle. These cycles are repeated until the desired thickness of titanium nitride is formed.

In the illustrated embodiment, carrier gas continues to flow at a constant rate during both phases of each cycle. It will be understood, however, that reactants can be removed by evacuation of the chamber between alternating gas pulses. In one arrangement, the preferred reactor incorporates hardware and software to maintain a constant pressure during the pulsed deposition. The disclosures of U.S. Pat. No. 4,747,367, issued May 31, 1988 to Posa and U.S. Pat. No. 4,761,269, issued Aug. 2, 1988 to Conger et al., are incorporated herein by reference.

TABLE III

| Phase | Carrier Flow (slm) | Reactant | Reactant Flow (sccm) | Temperature (° C.) | Pressure (Torr) | Time (sec) |
|---|---|---|---|---|---|---|
| metal | 600 | WF$_6$ | 50 | 400 | 10 | 0.25 |
| purge | 600 | — | — | 400 | 10 | 0.25 |
| nitrogen | 600 | NH$_3$ | 100 | 400 | 10 | 0.5 |
| purge | 600 | — | — | 400 | 10 | 1.0 |

Table III above presents parameters for ALD of tungsten nitride (WN). As noted, the metal source comprises tungsten hexafluoride (WF$_6$), the carrier gas comprises nitrogen (N$_2$) and the nitrogen source gas preferably comprises ammonia (NH$_3$). During each of the reaction phases, the reactants are supplied in sufficient quantity for the given other parameters to saturate the surface.

In this case, the metal monolayer formed in the metal phase is self-terminated with fluoride, which does not readily react with WF$_6$ under the preferred conditions. The preferred nitrogen source gas, however, reacts with or adsorbs upon the fluoride-terminated surface during the nitrogen phase in a reaction limited by the limited supply of tungsten fluoride complexes previously adsorbed. Moreover, nitridation leaves a nitrogen and NH$_x$ termination that does not further react with excess ammonia in the saturative phase.

TABLE IV

| Phase | Carrier Flow (slm) | Reactant | Reactant Flow (sccm) | Temperature (° C.) | Pressure (Torr) | Time (sec) |
|---|---|---|---|---|---|---|
| metal | 400 | WF$_6$ | 50 | 400 | 10 | 0.25 |
| purge | 400 | — | — | 400 | 10 | 0.8 |
| reduce | 400 | TEB | 50 | 400 | 10 | 0.01 |
| purge | 400 | — | — | 400 | 10 | 0.5 |
| nitrogen | 400 | NH$_3$ | 100 | 400 | 10 | 0.25 |
| purge | 400 | — | — | 400 | 10 | 0.5 |

Table IV above presents parameters for another ALD process for forming tungsten nitride (WN). The illustrated embodiment is particularly advantageous for directly depositing a barrier layer upon metal at the via floor and insulating surfaces of the trench and via, without an intermediate adhesion layer. As noted, the metal source comprises tungsten hexafluoride (WF$_6$), the carrier gas comprises nitrogen (N$_2$) and the nitrogen source gas preferably comprises ammonia (NH$_3$). In this case, a getter or scavenger removes the ligands left by the metal phase. In particular, a strong reducer, comprising TEB (triethyl boron) in the illustrated embodiment, reduces or otherwise removes the halogen-terminated metal complex monolayer. The nitrogen source gas then readily reacts with the reduced metal surface. In other arrangements, the getter can replace the halogen-termination in a ligand-exchange reaction, desirably leaving a surface reactive with a subsequent nitrogen-containing species. The nitrogen phase saturates the reaction sites left by the getter phase (i.e., the exposed tungsten surface in the illustrated embodiment) and leaves a nitrogen and NH$_x$ termination that does not further react with excess ammonia in the saturative phase.

The intermediate reduction phase results in a metal nitride crystallinity that exhibits lower resistivity than films formed by the ligand-exchange reaction of Table III. Such lowered resistivity is advantageous for the preferred dual damascene barrier context, where the barrier is placed in the conductive path of integrated circuit wires.

Moreover, the intermediate scavenger, as represented by the TEB pulse of Table IV, binds and carries away the halide tails left by the previous metal phase prior to introduction of the ammonia phase. Advantageously, the ammonia phase reacts directly with metal formed in the first phase, rather than liberating hydrogen halides (e.g., HF) in a ligand-exchange reaction. In contrast to HF, the complex produced by binding halides to the getter or scavenger does not corrode sensitive surfaces such as the metal at the bottom of the damascene structure. Accordingly, the metal line 52 of the dual damascene structure is protected from corrosive effects of HF or other halide species. The process of Table IV has been found particularly advantageous where, as in the preferred embodiment, the metal line 52 comprises copper. Etching of the copper is minimized and uniformity of the blanket metal nitride deposition is thereby improved.

Once an initial, thin layer (e.g., about 3-10 nm) of metal nitride (e.g., WN) is formed by the method of Table IV, further deposition of barrier and/or adhesion materials can proceed without the intermediate scavenger phase. Two phase cycles employing ligand-exchange reactions can more efficiently produce a thicker barrier layer over the initial layer. For example, WN by the method of Table IV can be followed by further deposition of TiN, such as by the method of Table II. The upper TiN surface of a WN/TiN barrier demonstrates better compatibility with some process flows.

Methods of Forming Metal Seed Layers

After formation of the metal nitride barrier layer, a seed layer may be desirable, depending upon the method to be employed for filling the dual damascene structure and the conductivity of the deposited barrier layer. In the illustrated embodiment, a copper filler is desirably electroplated over the illustrated metal nitride barriers. Accordingly, a highly conductive seed layer is preferably first formed over the barrier layer.

As is known in the art, the seed layer preferably comprises a metal layer, more preferably copper, and can be deposited by any of a number of processes. For example, state-of-the-art processing employs PVD or sputtering to form a copper seed layer. In conjunction with high step coverage obtained in forming the prior metal nitride barrier layer by ALD, such methods may be adequate for many dual damascene schemes.

Preferably, a CVD process is employed to deposit the seed layer with higher step coverage. Metal organic CVD (MOCVD) techniques are disclosed, for example, by Wolf et al., "Process and equipment simulation of copper chemical vapor deposition using Cu(HFAC)VTMS," Microelectronic Engineering, Vol. 45, No. 1, pp. 15-27 (February 1999), the disclosure of which is incorporated herein by reference.

Most preferably, the seed layer is also formed by ALD. The volume saved by high step coverage formation of one or more of the adhesion, barrier and seed layers thus contributes to a higher-conductivity line due to a greater volume available for the more conductive filler metal and increased chance of completely filling the contact vias and trenches.

TABLE V

| Phase | Carrier Flow (slm) | Reactant | Reactant Flow (sccm) | Temperature (° C.) | Pressure Torr) | Time (sec) |
|---|---|---|---|---|---|---|
| metal | 400 | CuCl | 4 | 350 | 10 | 0.2 |
| purge | 400 | — | — | 350 | 10 | 0.5 |
| reduce | 400 | TEB | 40 | 350 | 10 | 0.2 |
| purge | 400 | — | — | 350 | 10 | 0.5 |

Table V above illustrates an ALD pure metal process, similar to that of Table I above. In alternating phases, copper chloride is first adsorbed and then reduced by TEB. Advantageously, copper chloride is a smaller reactive species compared to organic copper species, facilitating rapid and more complete saturation of reactive sites on the workpiece.

Resultant Trench and Via Liners

Figure 10:
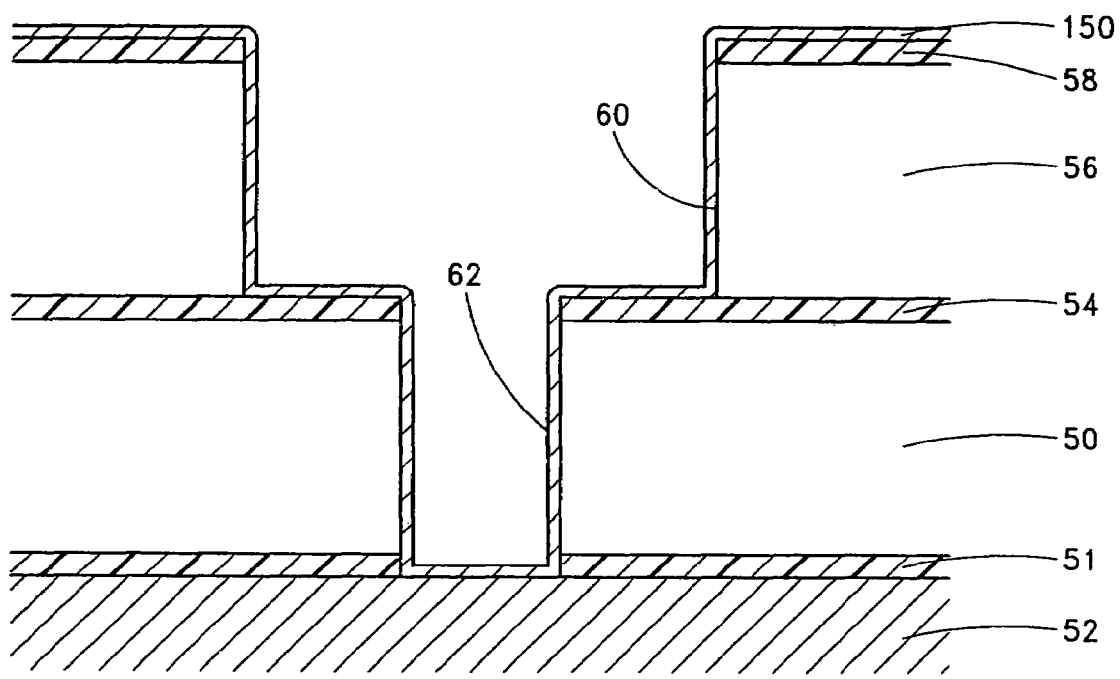

Referring now to FIG. 10, the dual damascene structure of FIG. 9A is illustrated with a high step coverage lining layer 150, constructed in accordance with processes set forth above. As previously noted, depending upon the materials of the via and trench structure and the chemistries of the various deposition steps, the liner 150 can comprise an initial metal adhesion layer in addition to a metal nitride barrier layer. The lining layer 150 can comprise, for example, a bilayer of W/TiN, W/WN, Ti/TiN, Ti/WN, and any of a number of other combinations of adhesion film and barrier film. In the example of Table IV, the barrier layer is deposited directly over metal and insulating surfaces of the dual damascene structure, and can optionally comprise a WN/TiN bilayer. Preferably, at least one of the sublayers is formed by ALD, in accordance with the methods disclosed above.

In accordance with the barrier needs of dual damascene processing, and particularly in conjunction with fast-diffusing copper metal filler, the metal nitride barrier layer of the lining layer 150 is formed to about the minimal thickness necessary for adequate performance of its barrier function. Accordingly, the metal nitride layer lining the deep trench and via structure preferably has a thickness greater than about 20 Å. At the same time, high step coverage provided by the methods disclosed herein enable formation of the desired thickness uniformly over all surfaces of the trench 60 and contact via 62, including insulating sidewalls and a conductive via floor. Accordingly, the metal nitride liner within the via 62 is preferably no more than about 200 Å at any point of the structure and at any point during the process. More preferably, the metal nitrides of the preferred embodiments are deposited to a thickness of between about 20 Å and 100 Å, and most preferably between about 40 Å and 80 Å.

Under the preferred conditions, material sufficient for a fraction of a monolayer is deposited per cycle, due to the physical size of the chemisorbed species preventing occupation of all available sites, particularly if the adsorbed species include organic ligands. In example of Table II, TiN grows at about 0.35 Å/cycle, such that preferably greater than about 50 cycles, more preferably between about 60 and 300 cycles, and most preferably between about 60 and 200 cycles are performed to produce an adequate TiN barrier layer to prevent copper diffusion.

As noted, the methods described herein enable extremely high step coverage (defined as a thickness of the liner on the bottom of the via as a ratio of the thickness of the liner on sidewalls of the via), even of the high aspect ratio trench and via structures of the preferred embodiments. The lining layer 150, and particularly ALD-formed film(s) within the liner 150, preferably exhibit step coverage greater than about 90%, more preferably greater than about 93%, and most preferably greater than about 97%.

Figure 11:
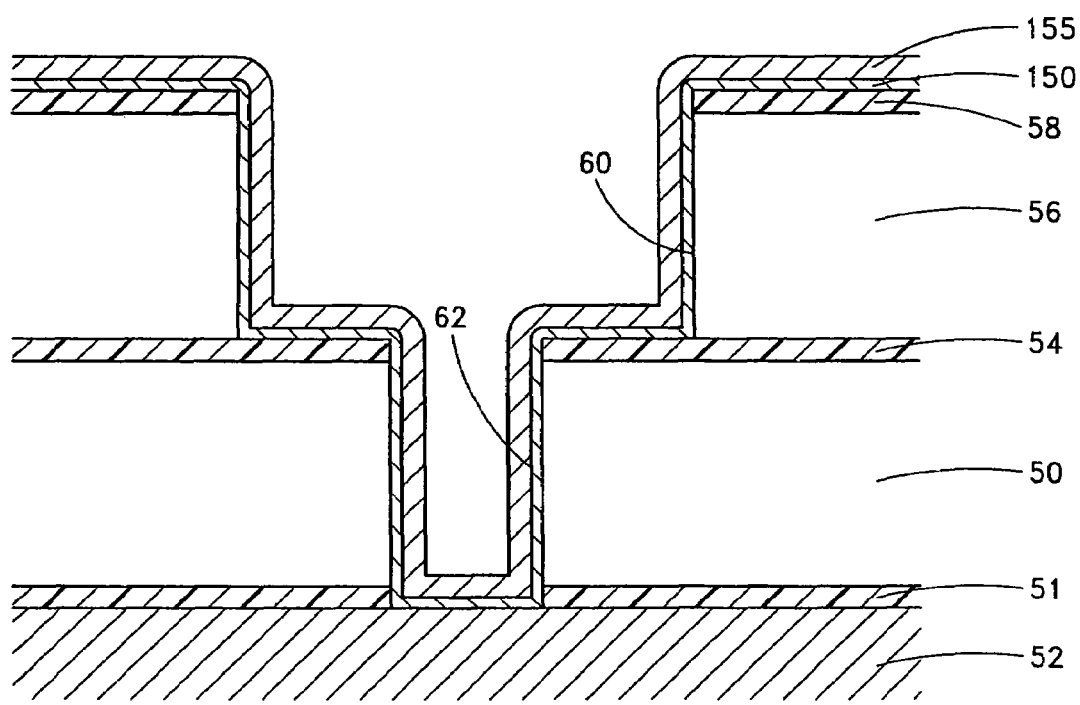

With reference now to FIG. 11, a seed layer 155 is optionally formed over the lining layer 150. As noted above, such a seed layer 155 is desirable where the filling metal is to be deposited by electroplating and where the lining layer 155 demonstrates inadequate conductivity for effective electroplating. Under such conditions, the seed layer 155 can be deposited by PVD, more preferably by CVD and most preferably by ALD. In the illustrated embodiment, a "pure" copper is employed for the seed layer. In other arrangements, tungsten can be used as an electroplating seed layer. In still other arrangements, no seed layer is employed over the lining layer 150, such as in process flows preceding a non-electroplating fill procedure or where the barrier layer is adequately conductive (e.g., tungsten nitride), and enables direct nucleation of electroplated copper.

Figure 12:
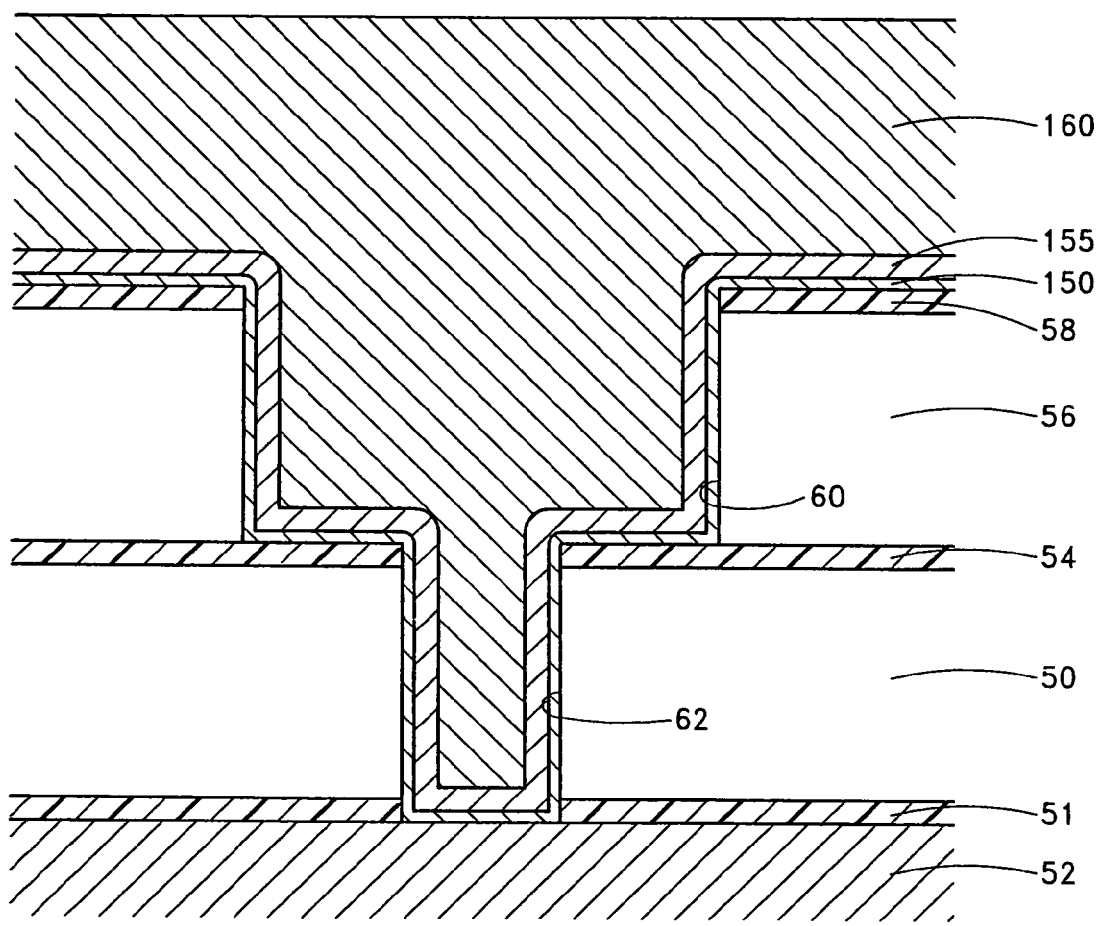

Referring now to FIG. 12, the lined damascene structure is then filled with a highly conductive metal 160. In the illustrated embodiment, where a seeding film is formed over the lining layer 150, the filler metal 160 preferably comprises electroplated copper. In other arrangements, metal such as aluminum can be deposited under high pressure and/or high temperatures to aid reflow into the deep trench and via structures, as will be appreciated by the skilled artisan. Effective barriers are also important in preventing spiking during the harsh conditions attending such deposition processes.

Figure 13:
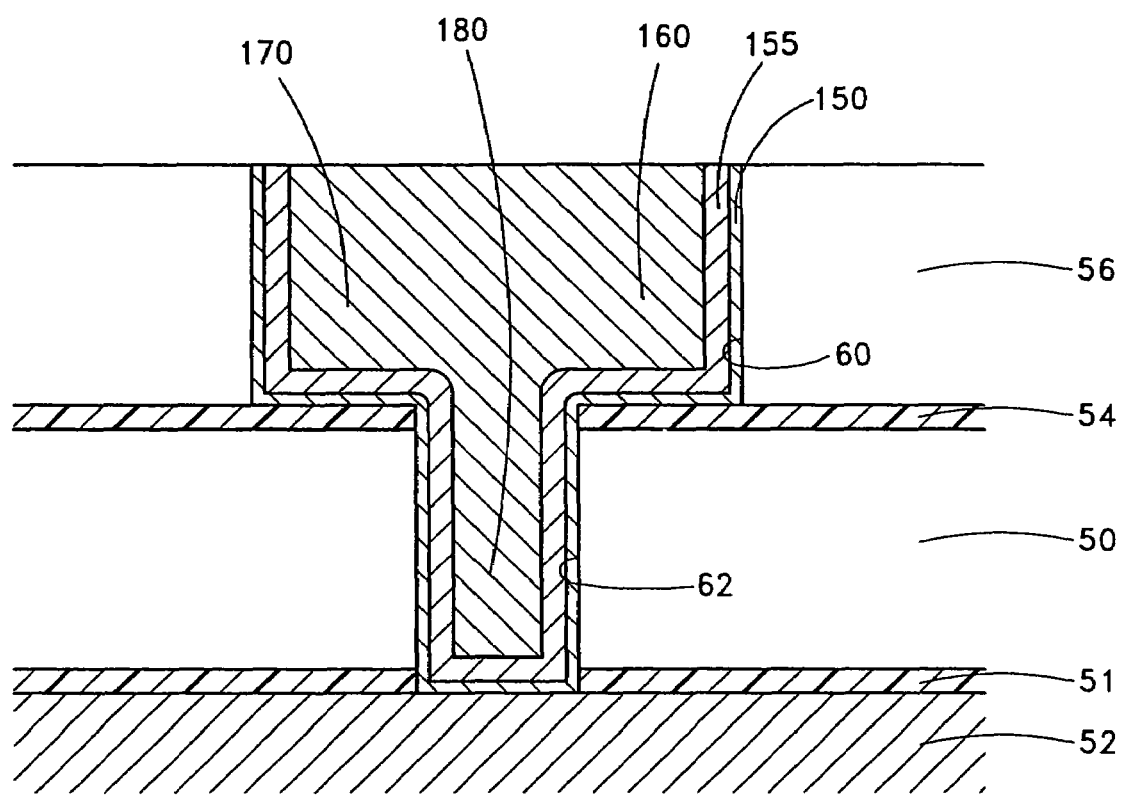

With reference now to FIG. 13, the structures are then planarized by chemical mechanical planarization (CMP) or other etch back process to leave isolated lines 170 within the trenches 60, having integral contacts 180 extending downwardly therefrom. Diffusion of the filler metal 160 is prevented both during the fill process as well as during any high temperature processing that follows.

Although the foregoing invention has been described in terms of certain preferred embodiments, other embodiments will be apparent to those of ordinary skill in the art. For example, while processes are specifically provided particular lining materials, the skilled artisan will readily appreciate that ALD methods can be applied to lining damascene structures with other materials. Moreover, although illustrated in connection with a particular process flow and structure for dual damascene metallization, the skilled artisan will appreciate variations of such schemes for which the methods disclosed herein will have utility. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

What is claimed is:

1. A metallization process, comprising:
    forming an opening in a porous low k dielectric material above a semiconductor substrate in a process chamber to expose at least part of an underlying conductive element;
    depositing no more than about one monolayer of a tantalum-containing species on surfaces of the opening;
    reacting the no more than about one monolayer with a reducer; and
    forming a lining layer by reacting a reactant species with the no more than about one monolayer after reacting the no more than about one monolayer with the reducer and before introducing any other reactants into the reaction chamber, wherein the lining layer conformally lines the opening, including the exposed part of the underlying conductive element.

2. The method of claim 1, wherein the reactant species is a non-radical species.

3. The process of claim 2, wherein the reactant species is a nitrogen precursor.

4. The process of claim 3, wherein the reactant species is ammonia.

5. The method of claim 1, wherein depositing the no more than about one monolayer comprises:
    introducing a tantalum precursor into the process chamber; and
    removing the tantalum precursor from the process chamber before reacting the no more than about one monolayer with the reducer.

6. The process of claim 1, wherein the tantalum precursor comprises an organic ligand.

7. The process of claim 6, wherein the tantalum precursor is pentakis(dimethylamino)tantalum.

8. The process of claim 1, wherein the tantalum precursor comprises a halide ligand.

9. The process of claim 8, wherein the tantalum precursor is $TaCl_5$.

10. The process of claim 1, wherein the reducer is triethyl boron.

11. The process of claim 1, wherein the lining layer has a step coverage of greater than about 90%.

12. The process of claim 1, wherein the opening has a width of less than about 0.35 μm.

13. The method of claim 1, wherein depositing no more than about one monolayer of a tantalum-containing species on surfaces of the opening comprises depositing directly on surfaces of the opening in the porous low k dielectric material.

14. The method of claim 1, wherein forming a lining layer comprises forming an adhesion layer prior to depositing a barrier layer thereover.

15. The method of claim 1, further comprising providing a surface termination of the exposed part of the underlying conductive element prior to depositing no more than one monolayer of the tantalum-containing species.

16. The method of claim 15, wherein providing the surface termination comprises performing an ammonia treatment.

* * * * *